/ US 8,730,743 B2 /

(12) United States Patent
Cho

(10) Patent No.: US 8,730,743 B2
(45) Date of Patent: May 20, 2014

(54) REPAIR METHOD AND INTEGRATED CIRCUIT USING THE SAME

(75) Inventor: Yong Deok Cho, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 199 days.

(21) Appl. No.: 13/336,906

(22) Filed: Dec. 23, 2011

(65) Prior Publication Data

US 2012/0257462 A1     Oct. 11, 2012

(30) Foreign Application Priority Data

Apr. 11, 2011  (KR) .................... 10-2011-0033424

(51) Int. Cl.
*G11C 7/06*   (2006.01)

(52) U.S. Cl.
USPC .............. 365/189.07; 365/185.09; 365/132; 365/200; 365/201; 365/230.01; 365/230.06

(58) Field of Classification Search
USPC ............. 365/185.09, 132, 189.07, 200, 201, 365/230.01, 230.06
See application file for complete search history.

(56) References Cited

U.S. PATENT DOCUMENTS

| 7,734,966 B1* | 6/2010 | Lee et al. ................. 714/718 |
| 2009/0037779 A1* | 2/2009 | Kawakami et al. .......... 714/48 |
| 2009/0039463 A1* | 2/2009 | Kang ........................ 257/529 |
| 2011/0016352 A1 | 1/2011 | Ong et al. |

FOREIGN PATENT DOCUMENTS

| KR | 100331840 B1 | 3/2002 |
| KR | 1020020068768 A | 8/2002 |
| KR | 1020030058256 A | 7/2003 |

* cited by examiner

*Primary Examiner* — Fernando Hidalgo
(74) *Attorney, Agent, or Firm* — William Park & Associates Patent Ltd.

(57) ABSTRACT

An integrated circuit includes: a memory controller configured to determine whether a memory cell included in a semiconductor memory device is defective or not and extract a fail address having positional information of the defective memory cell, in a test mode; and a fail address storage unit configured to store the fail address.

16 Claims, 4 Drawing Sheets

REPAIR METHOD AND INTEGRATED CIRCUIT USING THE SAME

CROSS-REFERENCES TO RELATED APPLICATIONS

The present application claims priority under 35 U.S.C 119(a) to Korean Application No. 10-2011-0033424, filed on Apr. 11, 2011, in the Korean intellectual property Office, which is incorporated herein by reference in its entirety.

BACKGROUND

With increasing integration of semiconductor memory devices, there is a high probability that a failure occurs during a fabrication process of semiconductor cells. This may cause the reduction in yield. In general, although a semiconductor memory device has a small number of failed memory cells, the semiconductor memory device may not be shipped as a product.

In order to reduce the occurrence of failure due to high integration of semiconductor memory devices, a variety of repair methods have been proposed. Representative examples of the repair methods may include a fuse cutting method using laser and an electrical fuse cutting method using a high voltage.

FIG. 1 is a flow chart showing a known repair method for changing a failed cell into a normal cell.

Referring to FIG. 1, the repair method for changing a failed cell into a normal cell may comprise a repair method using fuse cutting in a wafer state and perform a repair method using electrical fuse cutting after packaging.

First, a wafer test entry step S1 is to enter a test for testing a memory cell in which a failure occurs in a wafer state. A repair determination step S2 is to determine whether the failed memory cell checked through the test can be repaired or not. A failure decision step S3 comprises deciding a wafer having a memory cell which was determined to be unrepairable in the repair determination step S2, as a failed wafer, without performing a repair. A fuse cutting step S4 is to perform fuse-cutting using laser only on the wafer which was determined to be repairable in the repair determination step S2 and replace the failed memory cell with a normal memory cell. A wafer test termination step S5 is to terminate the wafer test because the failed memory cell has been replaced with a normal memory cell in the fuse cutting step S4.

A packaging step S6 is to package a wafer having normal memory cells. A package test entry step S7 is to verify whether a failure has occurred while a heat treatment process or the like is performed in the packaging step S6. A repair determination step S8 is to perform a test and discriminate a package in which a failure occurred and a package in which no failure occurred. An electrical fuse cutting step S9 is to replace a failed memory cell with a normal memory cell by performing electrical fuse cutting on the package in which a failure occurred during the package step S6. A test termination step S10 is to terminate the test so as to ship the package having no failure and the package repaired in the electrical fuse cutting step S9.

As such, the repair is performed by the fuse cutting method and the electrical fuse cutting method, in order to repair a failed chip into a normal chip.

In the known repair method, however, a plurality of fuses are provided to perform the fuse cutting method, and an electrical fuse circuit and a high voltage generation circuit are provided to perform the electrical fuse cutting method. Therefore, this configuration increases the layout area of the semiconductor memory device. Furthermore, the fuse cutting method and the electrical fuse cutting method do not allow two or more programming operations. Accordingly, it is impossible to repair a failure which occurs while a user uses an integrated circuit.

SUMMARY

An embodiment of the present invention relates to a repair method and an integrated circuit using the same, which extract an address of a failed memory cell and replace the failed memory cell with a redundant cell using the extracted address of the failed memory cell, thereby repairing the failed memory cell which occurs during the use.

In an embodiment, an integrated circuit includes: a memory controller configured to determine whether a memory cell included in a semiconductor memory device is defective or not and extract a fail address having positional information of the memory cell, in a test mode; and a fail address storage unit configured to store the fail address in the test mode.

In an embodiment, a repair method of an integrated circuit includes: determining whether a memory cell included in a semiconductor memory device is defective or not and extracting a fail address having positional information of the memory cell, in a test mode; and replacing the memory cell corresponding to the fail address with a redundant cell, when the integrated circuit exits from the test mode.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
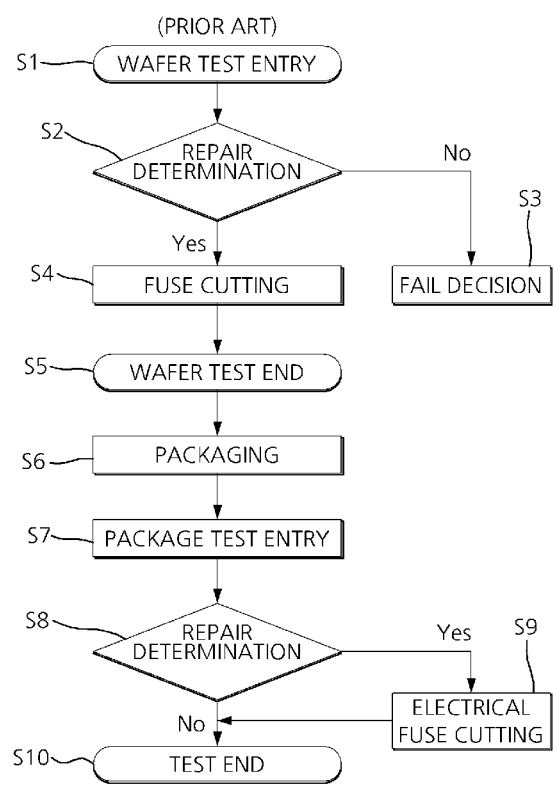
FIG. 1 is a flow chart showing a known repair method for repairing a failed cell into a normal cell.
Figure 2:
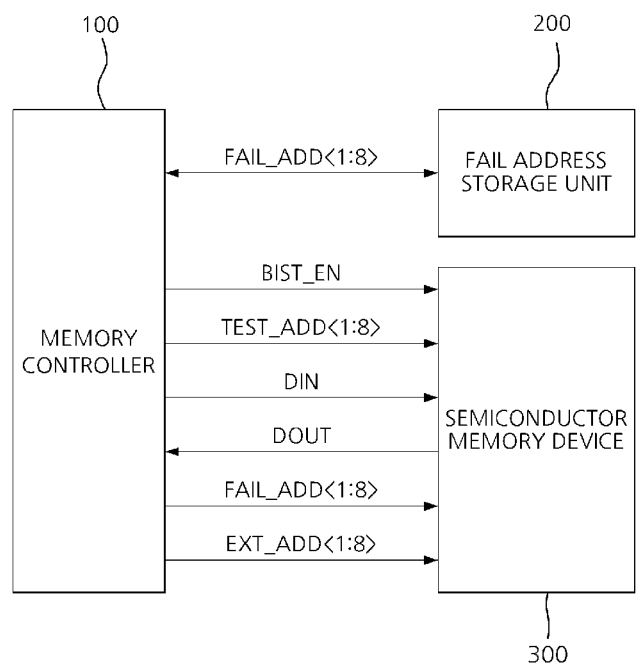
FIG. 2 is a block diagram of an integrated circuit in accordance with an embodiment of the present invention.

FIG. 2 is a block diagram of an integrated circuit using a repair method in accordance with an embodiment of the present invention.

Referring to FIG. 2, the integrated circuit includes a memory controller 100, a fail address storage unit 200, and a semiconductor memory device 300. The memory controller 100 is configured to determine whether a memory cell (not illustrated) are defective or not, and extract fail addresses FAIL_ADD<1:8> having positional information of the defective memory cell, when the integrated circuit enters a test mode. The fail address storage unit 200 is configured to store the fail addresses FAIL_ADD<1:8> during the test mode. The semiconductor memory device 300 is configured to replace the memory cell corresponding to the fail addresses FAIL_ADD<1:8> with a redundant cell (not illustrated).

In the test mode of the integrated circuit, the memory controller 100 outputs test addresses TEST_ADD<1:8> which are sequentially counted and generated and input data DIN which are to be written into a memory cell (not illustrated), and stores the test addresses TEST_ADD<1:8> as the fail addresses FAIL_ADD<1:8> if the input data DIN are not identical to output data DOUT read from the memory cell. Furthermore, the memory controller 100 outputs external addresses EXT_ADD<1:8> and the fail addresses FAIL_ADD<1:8>.

The fail address storage unit 200 receives and stores the fail addresses FAIL_ADD<1:8> during the test mode, and outputs the fail addresses FAIL_ADD<1:8> to the memory controller 100. For example, the fail addresses FAIL_ADD<1:8> may be transmitted to the memory controller 100 when the integrated circuit exits from the test mode. Here, the fail address storage unit 200 may include a nonvolatile element so as to retain the fail addresses FAIL_ADD<1:8> even in absence of power.

Figure 3:
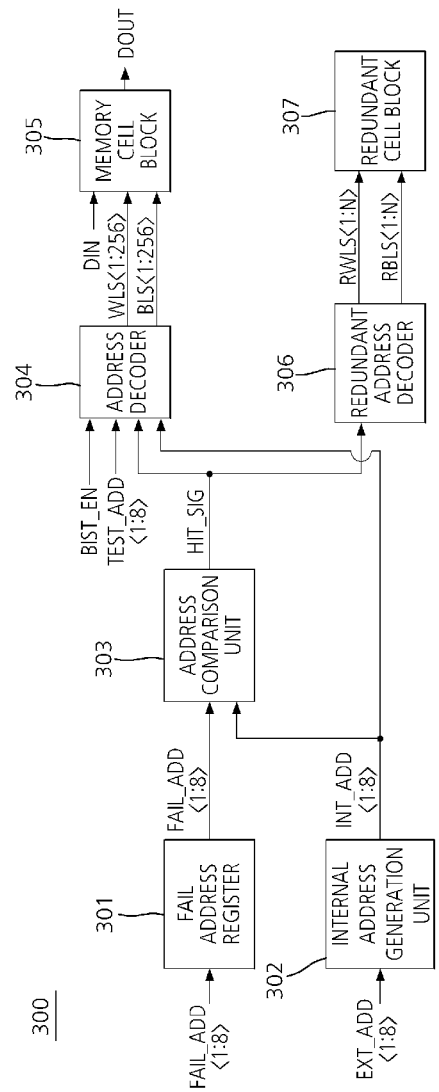
FIG. 3 is a block diagram of a semiconductor memory device of FIG. 2.

Referring to FIG. 3, the semiconductor memory device 300 includes a fail address register 301, an internal address generation unit 302, an address comparison unit 303, an address decoder 304, a memory cell block 305, a redundant address decoder 306, and a redundant cell block 307.

The fail address register 301 is configured to receive the fail addresses FAIL_ADD<1:8>. The internal address generation unit 302 is configured to receive the external addresses EXT_ADD<1:8>and count and generate internal addresses INT_ADD<1:8>. The address comparison unit 303 is configured to compare the fail addresses FAIL_ADD<1:8> with the internal addresses INT_ADD<1:8> and generate a repair signal HIT_SIG.

Figure 4:
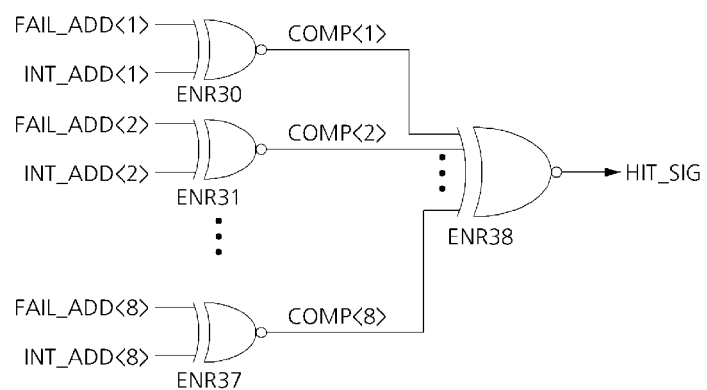
FIG. 4 is a circuit diagram of an address comparison unit of FIG. 3.

More specifically, referring to FIG. 4, the address comparison unit 303 includes a plurality of exclusive nor gates ENR30 to ENR37 configured to compare the first to eighth fail addresses FAIL_ADD<1:8> with the first to eighth internal addresses INT_ADD<1:8> and generate first to eighth comparison signals COMP<1:8>, and an exclusive nor gate ENR38 configured to compare the first to eighth comparison signals COMP<1:8> and generate the repair signal HIT_SIG. Here, the address comparison unit 303 enables the repair signal HIT_SIG to a logic high level when the first to eighth fail addresses FAIL_ADD<1:8> are identical to the first to eighth internal addresses INT_ADD<1:8>, and disables the repair signal HIT_SIG to a logic low level when the first to eighth fail addresses FAIL_ADD<1:8> are not identical to the first to eighth internal addresses INT_ADD<1:8>.

When the integrated circuit enters the test mode, the address decoder 304 decodes test addresses TEST_ADD<1:8> in response to a test enable signal BIST_EN and selectively enables word line select signals WLS<1:256> and bit line select signals BLS<1:256>. Furthermore, the address decoder 304 decodes the internal addresses INT_ADD<1:8> in response to the test enable signal BIST_EN which is disabled when the integrated circuit exits from the test mode, and selectively enables the word line select signals WLS<1:256> and the bit line select signals BLS<1:256>. Here, the test enable signal BIST_EN is a signal which is enabled during the test mode and inputted from the memory controller 100.

When the integrated circuit enters the test mode such that a memory cell (not illustrated) is selected according to the word line select signals WLS<1:256> and the bit line select signals BLS<1:256> selected by decoding the test addresses TEST_ADD<1:8> to perform a write operation, the memory cell block 305 writes input data DIN into the memory cell. When a memory cell (not illustrated) is selected in such a manner to perform a read operation, the memory cell block 305 outputs data of the memory cell as output data DOUT. Furthermore, when the integrated circuit exits from the test mode such that a memory cell (not illustrated) is selected according to the word line select signals WLS<1:256> and the bit line select signals BLS<1:256> selected by decoding the internal addresses INT_ADD<1:8> to perform a write operation, the memory cell block 305 writes input data DIN into the memory cell. Furthermore, when a memory cell (not illustrated) is selected in such a manner to perform a read operation, the memory cell block 305 outputs data of the memory cell as output data DOUT.

The redundant address decoder 306 sequentially enables redundant word line select signals RWLS<1:N> and redundant bit line select signals RBLS<1:N> when the repair signal HIT_SIG is enabled to a logic high level. The redundant cell block 307 selects redundant cells (not illustrated) in response to the redundant word line select signals RWLS<1:N> and the redundant bit line select signals RBLS<1:N>. Here, the number of redundant cells selected in response to the redundant word line select signals RWLS<1:N>and the redundant bit line select signals RBLS<1:N> may be set to be larger than the number of failed memory cells (not illustrated).

The operation of the integrated circuit configured in such a manner will be described with reference to FIGS. 2 to 4. The following descriptions will be focused on a case in which a failure occurs in a memory cell (not illustrated) selected by the internal addresses INT_ADD<1:8>.

First, when the integrated circuit enters the test mode, the memory controller 100 outputs the test addresses TEST_ADD<1:8> which are sequentially counted and generated and input data DIN, and enables the test enable signal BIST_EN.

The address decoder 304 of the semiconductor memory device 300 decodes the test addresses TEST_ADD<1:8> in response to the test enable signal BIST_EN, and selectively enables the word line select signals WLS<1:256> and the bit line select signals BLS<1:256>. The memory cell block 305 writes the input data DIN into the selected memory cell and outputs data of the selected memory cell as output data DOUT, in response to the word line select signals WLS<1:256> and the bit line select signals BLS<1:256>.

When a failure occurs in the memory cell selected according to the test addresses TEST_ADD<1:8>, the input data DIN are not identical to the output data DOUT. Therefore, the memory controller 100 stores the test addresses TEST_ADD<1:8> corresponding to the fail memory cell as the fail addresses FAIL_ADD<1:8>, and outputs the fail addresses FAIL_ADD<1:8> to the fail address storage unit 200.

The fail address storage unit 200 receives the fail addresses FAIL_ADD<1:8> outputted from the memory controller 100 and stores the fail addresses FAIL_ADD<1:8>.

Next, when the integrated circuit exits from the test mode, the memory controller 100 outputs the external addresses EXT_ADD<1:8> and the fail addresses FAIL_ADD<1:8> received from the fail address storage unit 200.

The fail address register 301 of the semiconductor memory device 300 receives and stores the fail addresses FAIL_ADD<1:8>. The internal address generation unit 302 receives the external addresses EXT_ADD<1:8> and counts and generates the internal addresses INT_ADD<1:8>. Since the internal addresses INT_ADD<1:8> are identical to the fail address FAIL_ADD<1:8>, the address comparison unit 303 enables the repair signal HIT_SIG to a logic high level.

Since the test enable signal BIST_EN is disabled and the repair signal HIT_SIG is enabled to a logic high level, the address decoder 304 is not driven and does not select the redundant word line select signals RBLS<1:N> and the redundant bit line select signals RBLS<1:N>. The memory cell block 305 does not select a memory cell (not illustrated) in which a failure occurs, because the redundant word line select signals RBLS<1:N> and the redundant bit line select signals RBLS<1:N> are not selected. The redundant address decoder 306 enables the word line select signals WLS<1:256> and the bit line select signals BLS<1:256> in response to the high-level repair signal HIT_SIG. The redundant cell block 307 selects a redundant cell (not illustrated) in response to the redundant word line select signals RBLS<1:N> and the redundant bit line select signals RBLS<1:N>, and replaces the failed memory cell in the memory cell block 305 with the redundant cell.

The repair method and the integrated circuit using the same in accordance with the embodiment of the present invention do not require a plurality of fuses, an electrical fuse circuit, and a high voltage generation circuit, which were provided to use the conventional repair method. Therefore, the layout area of the integrated circuit may be reduced. Furthermore, since the integrated circuit independently performs a repair, it is possible to repair a failure which occurs while the integrated circuit is used.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An integrated circuit comprising:
    a memory controller configured to determine whether a memory cell included in a semiconductor memory device is defective or not and extract a fail address having positional information of the defective memory cell, in a test mode; and
    a fail address storage unit configured to store the fail address,
    wherein the semiconductor memory device comprises:
        a fail address register configured to store the fail address;
        an internal address generation unit configured to receive a external address and count and generate an internal address;
        an address comparison unit configured to compare the fail address with the internal address and generate a repair signal;
        an address decoder configured to enable a word line select signal and a bit line select signal of a memory cell corresponding to the test address or enable the word line select signal and the bit line select signal of a memory cell corresponding to the internal address, in response to the test mode enable signal and the repair signal; and
        a redundant address decoder configured to enable a redundant word line select signal and a redundant bit line select signal of a redundant cell in response to the repair signal.

2. The integrated circuit of claim 1, wherein the memory controller outputs the test address which is sequentially counted when the integrated circuit enters the test mode, and outputs input data which is to be written into the memory cell.

3. The integrated circuit of claim 2, wherein the memory controller outputs the test address as the fail address, when the input data is not identical to output data read from the semiconductor memory device.

4. The integrated circuit of claim 1, wherein the fail address storage unit comprises a nonvolatile element.

5. The integrated circuit of claim 1, wherein the memory controller receives the fail address from the fail address storage unit and outputs the fail address and the external address, when the integrated circuit exits from the test mode.

6. The integrated circuit of claim 1, wherein the memory controller receives the fail address from the fail address storage unit and outputs the fail address.

7. The integrated circuit of claim 1 wherein the test mode enable signal is enabled when the integrated circuit enters the test mode.

8. The integrated circuit of claim 1, wherein the repair signal is enabled when the fail address is identical to the internal address.

9. The integrated circuit of claim 1, wherein the address comparison unit comprises:
    a first exclusive nor gate configured to compare a first fail address and a first internal address and generate a first comparison signal;
    a second exclusive nor gate configured to compare a second fail address and a second internal address and generate a second comparison signal; and
    a third exclusive nor gate configured to compare the first comparison signal with the second comparison signal and generate a repair signal.

10. The integrated circuit of claim 1, wherein the semiconductor memory device further comprises:
    a memory cell block comprising a plurality of memory cells which are driven in response to the word line select signal and the bit line select signal; and
    a redundant cell block comprising a plurality of redundant cells which are driven in response to the redundant word line select signal and the redundant bit line select signal.

11. The integrated circuit of claim 10, wherein the memory cell block writes the input data when entering the test mode to perform a write operation, and outputs the input data as the output data when performing a read operation.

12. A repair method of an integrated circuit, comprising:
    determining whether a memory cell included in a semiconductor memory device is defective or not and extracting a fail address having positional information of the memory cell, in a test mode;
    receiving an external address from a semiconductor memory device, and counting and generating an internal address;
    comparing the internal address with the fail address and generating a repair signal; and
    replacing the memory cell in which a failure occurred with a redundant cell in response to the repair signal.

13. The repair method of claim 12, wherein the fail address is replaced with the redundant cell when the integrated circuit exits from the test mode.

14. The repair method of claim 12, wherein the extracting of the fail address comprises:
    outputting a test address which is sequentially counted and generated by a memory controller and input data which is to be written into the memory cell; and
    storing the test address corresponding to the memory cell as the fail address in a fail address storage unit, when the input data is not identical to output data read from the memory cell.

15. The integrated circuit of claim 14, wherein the fail address storage unit comprises a nonvolatile element.

16. The integrated circuit of claim 12, wherein the repair signal is enabled when the fail address is identical to the internal address.

* * * * *